(12) United States Patent
Ota

(10) Patent No.: US 8,680,580 B2
(45) Date of Patent: Mar. 25, 2014

(54) FIELD EFFECT TRANSISTOR AND PROCESS FOR MANUFACTURING SAME

(75) Inventor: Kazuki Ota, Tokyo (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 298 days.

(21) Appl. No.: 12/742,587

(22) PCT Filed: Nov. 17, 2008

(86) PCT No.: PCT/JP2008/003339
§ 371 (c)(1),
(2), (4) Date: May 12, 2010

(87) PCT Pub. No.: WO2009/066434
PCT Pub. Date: May 28, 2009

(65) Prior Publication Data
US 2010/0270559 A1  Oct. 28, 2010

(30) Foreign Application Priority Data

Nov. 19, 2007 (JP) .................................. 2007-299383

(51) Int. Cl.
*H01L 21/02* (2006.01)
*H01L 29/66* (2006.01)
*H01L 29/15* (2006.01)
*H01L 31/0256* (2006.01)

(52) U.S. Cl.
USPC .......... 257/195; 257/190; 257/192; 257/194; 257/76

(58) Field of Classification Search
USPC .................................... 257/E29.31
See application file for complete search history.

(56) References Cited

U.S. PATENT DOCUMENTS

| 4,742,379 A * | 5/1988 | Yamashita et al. ............ 257/195 |
| 7,133,430 B2 | 11/2006 | Sato |

(Continued)

FOREIGN PATENT DOCUMENTS

| JP | 10-294534(A) | 11/1998 |
| JP | 2000-353789 A | 12/2000 |

(Continued)

OTHER PUBLICATIONS

International Search Report for PCT/JP2008/003339, mailed Feb. 17, 2009.

(Continued)

*Primary Examiner* — Fernando L Toledo
*Assistant Examiner* — Valerie N Newton
(74) *Attorney, Agent, or Firm* — McGinn Intellectual Property Law Group, PLLC

(57) ABSTRACT

A field effect transistor includes: a channel layer 103 containing GaN or InGaN; a first electron-supplying layer 104 disposed over the channel layer 103 and containing $In_xAl_yGa_{1-x-y}N$ ($0\leq x<1$, $0<y<1$, $0<x+y<1$); a first etch stop layer 105 disposed over the first electron-supplying layer 104 and containing indium aluminum nitride (InAlN); and a second electron-supplying layer 106 provided over the first etch stop layer 105 and containing $In_aAl_bGa_{1-a-b}N$ ($0\leq a<1$, $0<b<1$, $0<a+b<1$). A first recess 111, which extends through the second electron-supplying layer 106 and the first etch stop layer 105 and having a bottom surface constituted of a section of the first electron-supplying layer 104, is provided in the second electron-supplying layer 106 and the first etch stop layer 105. A gate electrode 109 covers the bottom surface of the first recess 111 and is disposed in the first recess 111. The second electron-supplying layer is provided so as to overlap with regions of an interface between the first electron-supplying layer 104 and the channel layer 106 except a region thereof under the bottom surface of the first recess 111 covering the gate electrode 109.

6 Claims, 8 Drawing Sheets

(56) References Cited

U.S. PATENT DOCUMENTS

| | | |
|---|---|---|
| 7,208,777 B1 * | 4/2007 | Inai et al. .................. 257/194 |
| 7,736,922 B2 | 6/2010 | Sato |
| 2008/0093626 A1 * | 4/2008 | Kuraguchi .................. 257/190 |

FOREIGN PATENT DOCUMENTS

| | | |
|---|---|---|
| JP | 2001-085670 A | 3/2001 |
| JP | 2001-185558 A | 7/2001 |
| JP | 2003-158296(A) | 5/2003 |
| JP | 2004-228340(A) | 8/2004 |
| JP | 2004-273655 A | 9/2004 |
| JP | 2005-183733 A | 7/2005 |
| JP | 2006-080152 A | 3/2006 |
| JP | 2007-035905 A | 2/2007 |
| JP | 2007-067240 A | 3/2007 |
| JP | 2007-165431 A | 6/2007 |
| WO | 2007/108055 A | 9/2007 |

OTHER PUBLICATIONS

Japanese Office Action dated Sep. 10, 2013 with partial English translation thereof.

* cited by examiner (a)

(b)

(c)

FIELD EFFECT TRANSISTOR AND PROCESS FOR MANUFACTURING SAME

TECHNICAL FIELD

The present invention relates to a field effect transistor employing a nitride semiconductor and a process for manufacturing thereof. In particular, the present invention relates to an enhancement (normally off) type field effect transistor and a process for manufacturing thereof.

BACKGROUND ART

Nitride semiconductor materials such as gallium nitride (GaN), aluminum gallium nitride (AlGaN), indium gallium nitride (InGaN), indium aluminum nitride (InAlN), indium aluminum gallium nitride (InAlGaN) and the like involve advantageous features such as higher dielectric breakdown voltage, higher thermal conductivity, higher electronic saturation velocity and the like. Due to these advantageous features, the nitride semiconductor materials are promising semiconductor materials for the use in manufacturing electric power devices in the field of radio frequency (RF) devices or manufacturing high power devices, and thus, in recent years, developments for achieving practical realizations of the field effect transistors employing nitride semiconductor material are actively conducted.

These applications require the enhancement (normally off) type devices, which require no negative DC bias power source to gate electrodes of field effect transistors. FIG. 6 shows an example of a conventionally proposed structure of an enhancement (normally off) type field effect transistor employing a nitride semiconductor material (see Japanese Patent Laid-Open No. 2005-183,733). A configuration of the enhancement type field effect transistor employing a nitride semiconductor illustrated in FIG. 6 will be briefly described. The enhancement type field effect transistor shown in FIG. 6 has a structure of so-called high electron mobility transistor (HEMT). The field effect transistor shown in FIG. 6 includes a substrate 1 having higher resistance such as sapphire substrate and a buffer layer 2 composed of GaN and having a thickness of 50 nm provided on the substrate 1. A channel layer 3 composed of GaN and having a thickness 400 nm, an intermediate layer 9 composed of aluminum nitride (AlN) and having a thickness of 1 nm and an electron-supplying layer 4 composed of undoped $Al_{0.2}Ga_{0.8}N$ and having a thickness of 30 nm are consecutively deposited on the buffer layer 2 to form a hetero junction structure. In addition, a source electrode S, a gate G and a drain electrode D are two-dimensionally arranged.

The field effect transistor having a conventional HEMT structure shown in FIG. 6 is provided with a recessed structure in a section 8 corresponding to the section right under the gate electrode G. More specifically, the thickness of the undoped $Al_{0.2}Ga_{0.8}N$ layer in the section 8 is 5 nm, while other sections of the undoped $Al_{0.2}Ga_{0.8}N$ layer constituting the electron-supplying layer 4 except the section 8 is 30 nm. In other sections thereof except the section 8, electron supplied from the electron-supplying layer 4 composed of the undoped $Al_{0.2}Ga_{0.8}N$ is accumulated in the hetero junction interface between the intermediate layer 9 composed of AlN and the channel layer 3 composed of GaN. Electron accumulated in the hetero junction interface between the intermediate layer 9 composed of AlN and the channel layer 3 composed of GaN constitutes a two-dimensional electron gas 6.

On the other hand, in the section 8, a depleted layer resulted from the presence of the gate electrode G, which is provided in the surface of the undoped $Al_{0.2}Ga_{0.8}N$ layer, reaches the channel layer 3 composed of GaN, even if the bias voltage of the gate electrode G is set to 0 V. As a result, no accumulation of electron is caused in the hetero junction interface between the intermediate layer 9 composed of AlN and the channel layer 3 composed of GaN located right under the section 8. More specifically, no two-dimensional electron gas 6 is formed in the section right under the region of the section 8 in the condition that the bias voltage of the gate electrode G is set to 0 V. Therefore, in the condition that the gate voltage $V_G$ applied to the gate electrode G is 0 V, a normally off condition is achieved, in which no drain current ID flows even if a drain voltage VD is applied between the source electrode S and the drain electrode D. On the other hand, when the gate voltage $V_G$ applied to the gate electrode G is biased to provide positive voltage of higher than a threshold voltage, drain current ID flows. This allows achieving the enhancement (normally off) type field effect transistor.

Next, the process operations for manufacturing the field effect transistor having the conventional HEMT structure as shown in FIG. 6 will be briefly described in reference to FIG. 7. First of all, the sapphire substrate 1 is introduced in a metal organic chemical vapor deposition (MOCVD) apparatus, and the MOCVD apparatus is evacuated with a turbo pump to achieve a vacuum pressure of not higher than $1 \times 10^{-6}$ hPa. Then, the pressure is increased to 100 hPa, and the temperature of the substrate 1 is elevated to 1,100 degrees C. Once the substrate temperature is stabilized, then the substrate 1 is rotated at 900 rpm. A source gas containing trimethylgallium (TMG) at a flow rate of 100 cm³/min. and ammonia at a flow rate of 12 l/min. is introduced over the surface of the substrate 1 to carry out a growth of the buffer layer 2 composed of GaN. The deposition time of 4 min. (240 sec.) provides a thickness of the buffer layer 2 of about 50 nm.

Then, trimethylgallium (TMG) at a flow rate of 100 cm³/min. and ammonia ($NH_3$) at a flow rate of 12 l/min. are introduced over the buffer layer 2 to carry out a growth of the channel layer 3 composed of GaN. The deposition time of 1,000 sec. provides a thickness of the channel layer 3 of 400 nm.

Then, trimethylaluminum (TMA) at a flow rate of 50 cm³/min. and ammonia at a flow rate of 12 Umin. are introduced to carry out a growth of the intermediate layer 9 composed of undoped AlN. Continuously, trimethylaluminum (TMA) at a flow rate of 50 cm³/min., trimethylgallium (TMG) at a flow rate of 100 cm³/min., and ammonia at a flow rate of 12 l/min., are introduced to carry out a growth of the electron-supplying layer 4 composed of $Al_{0.2}Ga_{0.8}N$. The deposition time of 40 sec. provides a thickness of the electron-supplying layer 4 of 30 nm. The layer structure $A_0$ shown in FIG. 7(a) is completed by the above-described operations.

After the epitaxial growth for the layer structure $A_0$ is completed, a silicon dioxide ($SiO_2$) film 10 is formed over the entire surface of the layer structure $A_0$. An opening is provided in the sectional region of the $SiO_2$ film 10 associated with the section 8 corresponding to the section right under the gate to expose a section of the electron-supplying layer 4 corresponding thereto. Then, the electron-supplying layer 4 having the total thickness of 30 nm is partially oxidized to a depth of 25 nm from the surface at a normal pressure, at a flow rate of oxygen gas of not higher than 5 l/min. and at a temperature of 900 degrees C. to form an oxide layer 11 (see layer structure $A_1$ in FIG. 7(b)).

Such oxidation process provides the thickness of the semiconductor layer of 5 nm in the section 8 of the electron-supplying layer 4 corresponding to the section right under the gate, which means that the thickness of the section 8 is thinner than the thickness of the semiconductor layer constituting the other section of the electron-supplying layer 4 except the section 8 corresponding to the section right under the gate. Subsequently, a phosphoric acid based-, a hydrochloric acid based-, a fluorinated acid based- or a nitric acid based-etchant is employed to consecutively remove the oxide layer 11 and the SiO$_2$ film 10 via a wet etching process. As a result, the concave section 7 is formed in the electron-supplying layer 4.

The two-dimensional electron gas 6 disappears from the section of the channel layer 3 in the concave section 7, as shown in the layer structure A$_2$ of FIG. 7(c), even in the stage that the Schottky conjunction with the surface of electron-supplying layer 4 and the gate electrode G is not yet formed. More specifically, even in the condition that no Schottky conjunction is formed on the surface of the electron-supplying layer 4, the conduction band edge E$_c$ of the section right under the concave section 7 in the channel layer 3 in the interface between the intermediate layer 9 and the channel layer 3 is in higher energy level than Fermi level E$_f$.

After the completion of the etching process, the source electrode S and the drain electrode D (both composed of Al/Ti/Au with thickness of 100 nm/100 nm/200 nm), and the gate electrode G in the concave section 7 (composed of Pt/Au with thickness of 100 nm/200 nm) are formed via an electron beam (EB) deposition process. As described above, the enhancement (normally off) type field effect transistor employing a nitride semiconductor according to the conventional technology as shown in FIG. 6 is obtained.

In addition to above, similar background technologies include technologies disclosed in Japanese Patent Laid-Open No. 2001-085,670 and Japanese Patent Laid-Open No. 2004-273,655.
[Patent Document 1] Japanese Patent Laid-Open No. 2005-183,733
[Patent Document 2] Japanese Patent Laid-Open No. 2001-085,670
[Patent Document 3] Japanese Patent Laid-Open No. 2004-273,655

DISCLOSURE OF THE INVENTION

Following problems are caused in the field effect transistor shown in FIG. 6. Since the resistance between the source and the drain at the time of the "ON-state" achieved by positively biasing the gate electrode G to provide the gate voltage V$_G$ that is higher than a threshold bias V$_{th}$, or namely so-called ON-resistance, is higher, the power consumption is increased. The following reasons for such problem may be considered.

The first factor (reason) is due to the occurrence of the following phenomenon. At the time the "ON-state" is achieved by providing the gate voltage V$_G$ to be higher than the threshold bias V$_{th}$, the two-dimensional electron gas is generated in the region right under the gate electrode G, so that the sheet resistance thereof is about 500Ω/□ (ohm/square), while some section of the region right under the concave section 7 is still remained in the condition that two-dimensional electron gas disappears. In the enhancement (normally off) type field effect transistor according to the conventional technology having the configuration shown in FIG. 6, a clearance is provided between the end of the concave section 7 and the gate electrode G. When the gate electrode G is positively biased to achieve the gate voltage V$_G$ to the threshold bias V$_{th}$, two-dimensional electron gas 6 is generated in the section of the channel layer 3 right under the gate electrode G. On the other hand, in the clearance section between the end of the aforementioned concave section 7 and the gate electrode G, the potential of the surface of the electron-supplying layer 4 is different from the potential of the surface of the electron-supplying layer 4 right under the gate electrode G, so that the section of the channel layer 3 right under the aforementioned clearance section is maintained in the condition without the two-dimensional electron gas 6. This results in increased resistance in such section to provide increased ON-resistance.

While Japanese Patent Laid-Open No. 2005-183,733 describes that "two-dimensional electron gas 6 disappears" right under the concave section 7, such "disappearance" does not provide the actual situation, in which the electron density is 0 cm$^{-2}$, and it should be considered to indicates the condition, in which the electron density is decreased to "immeasurable level". More specifically, it is considered to indicate that the two-dimensional electron gas 6 in such section is decreased to 1/1,000 or lower of that in the section except the concave section 7. Let us assume that two-dimensional electron gas 6 in the clearance section with the concave section 7 and gate electrode Gas described above is 1/1,000 of that in the other sections except the concave section, or more specifically, the sheet resistance in such other sections is about 501 kΩ/□, which is 1000 times of 500Ω/□. In view of the formation of the gate electrode G in the concave section 7 in the structure shown in the FIG. 6, a clearance of at least 0.2 μm should be provided between the gate electrode and the end of the concave section 7, in consideration of the accuracy in the alignment. If it is assumed that the clearance between the gate electrode G and the end of the concave section 7 is 0.2 μm, the resistance of the region right under such clearance is provided as 500,000×0.2/1000=100 Ωmm per each 1 mm gate width (=1000 μm). The resistance of such clearance with the gate electrode G and the end of the concave section 7 provides higher contribution to the ON-resistance, which is 20 times of that provided by the resistance in other sections except the concave section 7. Therefore, it can be understood that such phenomenon is the factor for considerably increasing the ON-resistance, even if the clearance with the gate electrode G and the end of the concave section 7 is smaller in a certain level.

In addition, the following problem is also caused in the technology described in Japanese Patent Laid-Open No. 2005-183,733.

The bottom surface of the concave section 7 is not flatly formed, and thus it is difficult to uniformly control the threshold bias V$_{th}$ in the same transistor. The factor (reason) for providing non-flat bottom surface of the concave section 7 will be described below. It is known that the currently available nitride semiconductor epitaxial wafer exhibits considerably larger density of threading dislocations extending from the substrate to the surface of the epitaxial layer, as compared with the conventional semiconductor substrates of silicon (Si) or gallium arsenide (GaAs) and epitaxial wafers thereof. The substrates of none-nitride semiconductor materials such as sapphire, silicon carbide (SiC), Si and the like exhibit considerably higher density of dislocation of $10^8$ to $10^9$ cm$^{-2}$, and in the case of employing the GaN substrate, which attracts attention in recent developments of violet-blue laser diodes, the density of the dislocation is about $10^6$ cm$^{-2}$. On the other hand, in the field of power devices, in which realization of normally off-type device is expected, the field effect transistor is designed to have a gate width (Wg) of at least 10 mm or larger, due to a need for flow larger electric current of not lower than 10 A. While the width of the concave section 7 in FIG. 6 is ordinarily designed to be about several micrometers (μm), and assume here that the width is 1 μm=$10^{-4}$ cm, then the region of the concave section 7 having $10^{-4 \times 1}$=$10^{-4}$ cm$^2$ is present in a single transistor having Wg=10 mm=1 cm. Thus, when sapphire, SiC, Si or the like is employed for the substrate, $10^4$ to $10^5$ of dislocations are present in the region of the concave section 7 in the single transistor, and even if GaN is employed for the substrate, about $1\times10^2$ dislocations are present in the region of the concave section 7. As described above, it is difficult to prevent a dislocation from being generated in the region of the concave sections 7 in the manufacture of transistors for the high-current application utilized in the field of the power devices.

As described above, when a thermal oxidation process is conducted for the concave section 7 having larger number of threading dislocation as disclosed in reference to FIG. 7, the oxidation is progressed at higher rate along the threading dislocations deep into the epitaxial layer. For example, even if the thickness of the oxide layer in the region without a dislocation is controlled to be 25 nm, the oxide layer having a thickness of several times to several tens of times thereof is formed in the section with the threading dislocations. Thus, a wet-etching of the formed oxide layer via an acid treatment process causes depressions in the section of the threading dislocations, or in other words, bumpy profile is created on the bottom surface of the concave section 7, which means that a flat surface cannot be formed. Since the threshold bias $V_{th}$ of the manufactured field effect transistor is determined with the thickness of the electron-supplying layer 4 that is remained in the bottom of the concave section 7, a problem is caused that the presence of the bumpy profile at the bottom surface of the concave section 7 causes different threshold bias $V_{th}$ by the regions within the single transistor.

On the other hand, a technique of employing a dry etching process for forming the concave section 7 may be employed in order to avoid causing a bumpy profile due to the use of the thermal oxidation, it is difficult to achieve a uniform etch rate over the wafer surface with such technique, and a problem of different threshold bias voltages $V_{th}$ by the transistors is caused. For example, when the concave section 7 is formed to have the depth of 25 nm, a variation in the depth of about 1.2 nm is generated over the wafer surface even if the variation of the etch rate over the wafer surface is reduced to 5%, and such variation is converted into a variation of the threshold bias $V_{th}$ of 150 to 250 mV, and thus it is hard to say that sufficient threshold bias control is ensured.

According to the above-described consideration, it has been found that main factors for providing increased "ON-resistance" in the enhancement (normally off) type field effect transistor having the configuration as shown in FIG. 6 are summarized in the following two aspects:

In the recess, it is difficult to control the size (length) of each of the regions remained on both sides of the gate electrode formed in such recess to be equal to or smaller than 0.2 μm; and In the region remained on both sides of such gate electrode, the thickness of the electron-supplying layer is reduced, and the section right under the region is in the condition that "two-dimensional electron gas disappears". In addition, it has been also found that main factors for poor controllability of the threshold bias $V_{th}$ in the process for manufacturing the conventional enhancement (normally off) type field effect transistor as shown in FIG. 7 are summarized in the following three aspects:

A manufacture of nitride semiconductor epitaxial wafers having sufficiently smaller density of the threading dislocation is difficult;

When the region of the concave section 7 is treated via a thermal oxidation process with such wafer, the rate of forming the oxide layer in the peripheral of the threading dislocation is considerably different from that in other region; and When a dry etching process is employed for forming the concave section 7 in order to provide a flat bottom surface, larger variation in the threshold bias is caused due to the variation in the etch rate over the wafer surface.

It has been found that the selection of the following structure and the process for manufacturing thereof are advantageous for solving these problems, and thus the present invention has been completed.

According to one aspect of the present invention, there is provided a field effect transistor, comprising: a channel layer containing gallium nitride (GaN) or indium gallium nitride (InGaN); a first electron-supplying layer, disposed over the channel layer and containing $In_xAl_yGa_{1-x-y}N$ ($0 \leq x<1$, $0<y<1$, $0<x+y<1$); a first layer, disposed over the first electron-supplying layer and containing indium aluminum nitride (InAlN); a second electron-supplying layer, provided over the first layer and containing $In_aAl_bGa_{1-a-b}N$ ($0 \leq a<1$, $0<b<1$, $0<a+b<1$); a source electrode and a drain electrode, provided over the second electron-supplying layer and disposed separately from each other; and a gate electrode provided between the source electrode and the drain electrode, wherein a first recess is provided in the second electron-supplying layer and the first layer, the first recess extending through thereof and having a surface of the first electron-supplying layer serving as a bottom surface, wherein the gate electrode covers the bottom surface of the first recess and is buried in the first recess, and wherein, in the upper viewpoint from the side of each of the layer surface, the second electron-supplying layer is provided so as to overlap with regions of an interface between the first electron-supplying layer and the channel layer except a region thereof under the bottom surface of the first recess covered by the gate electrode.

The above-described field effect transistor may be manufactured by a process described below. According to another aspect of the present invention, there is provided a process for manufacturing a field effect transistor, including: forming an channel layer containing GaN or InGaN; forming a first electron-supplying layer containing $In_xAl_yGa_{1-x-y}N$ ($0 \leq x<1$, $0<y<1$, $0<x+y<1$) over the channel layer; forming a first layer containing InAlN over the first electron-supplying layer; forming a second electron-supplying layer containing $In_aAl_bGa_{1-a-b}N$ ($0 \leq a<1$, $0<b<1$, $0<a+b<1$) over the first layer; providing a source electrode and a drain electrode over the second electron-supplying layer to be disposed separately from each other; forming a first mask over the second electron-supplying layer, the first mask having an opening formed in a region between the source electrode and the drain electrode; removing a section of the second electron-supplying layer exposed from the opening of the first mask and removing a section of the first layer under the second electron-supplying layer via a dry etching process to form a hole having a bottom surface constituted of a section of the first layer; forming a first recess by removing the section of the first layer constituting the bottom surface of the hole is removed via a wet etching process to expose the first electron-supplying layer; and providing a gate electrode embedded in the first recess, wherein, in the upper viewpoint from the side of each of the layer surface, the second electron-supplying layer is provided so as to overlap with regions of an interface between the first electron-supplying layer and the channel layer except a region thereof under the bottom surface of the first recess covered by the gate electrode.

According to the present invention, a field effect transistor, which is capable of maintaining constant threshold bias with reduced ON-resistance, can be provided.

BRIEF DESCRIPTION OF THE DRAWINGS

The above and other objects, advantages and features of the present invention will be more apparent from the following description of certain preferred embodiments taken in conjunction with the accompanying drawings.

BEST MODE FOR CARRYING OUT THE INVENTION

Preferable embodiments of the present invention will be described in reference to the annexed figures.

In all figures, an identical numeral is assigned to an element commonly appeared in the figures, and the detailed description thereof will not be repeated.

First Embodiment

Figure 1:
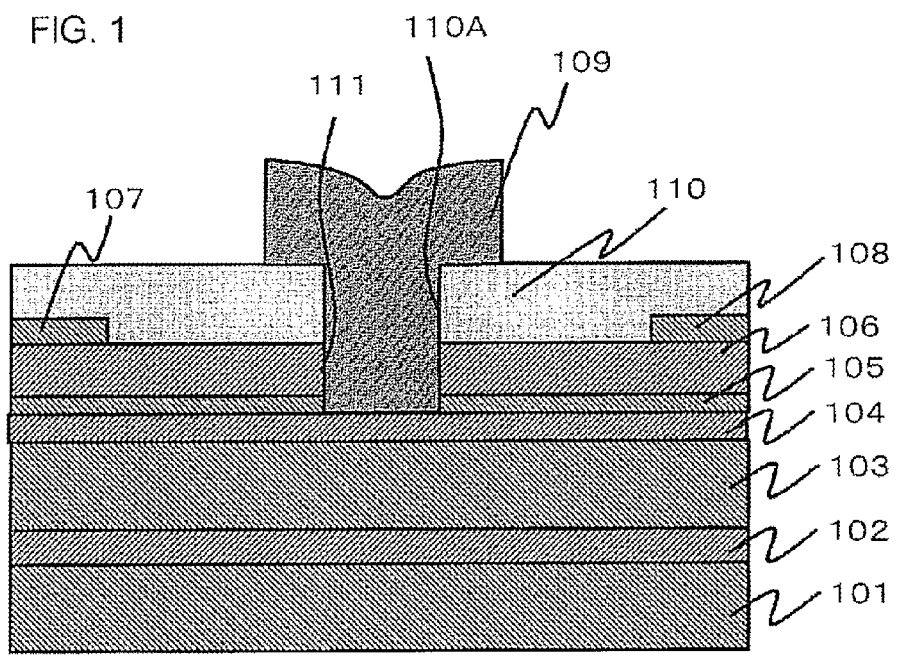
FIG. 1 is a cross-sectional view of a field effect transistor according to first embodiment of the present invention.
Figure 2:
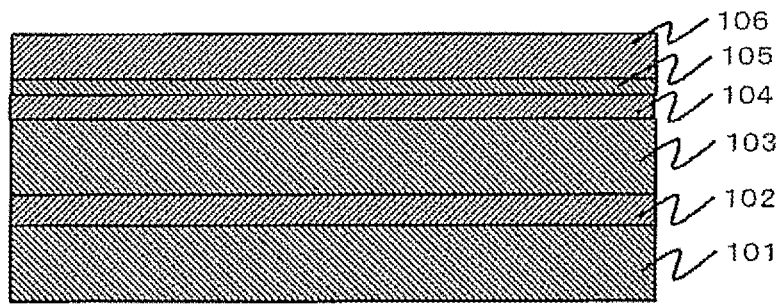
FIG. 2 includes cross-sectional views, illustrating a manufacturing process of a field effect transistor.
Figure 2:
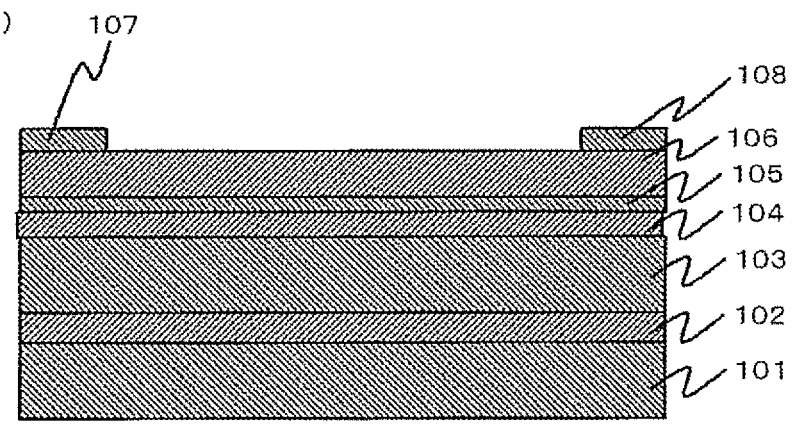
Figure 2:
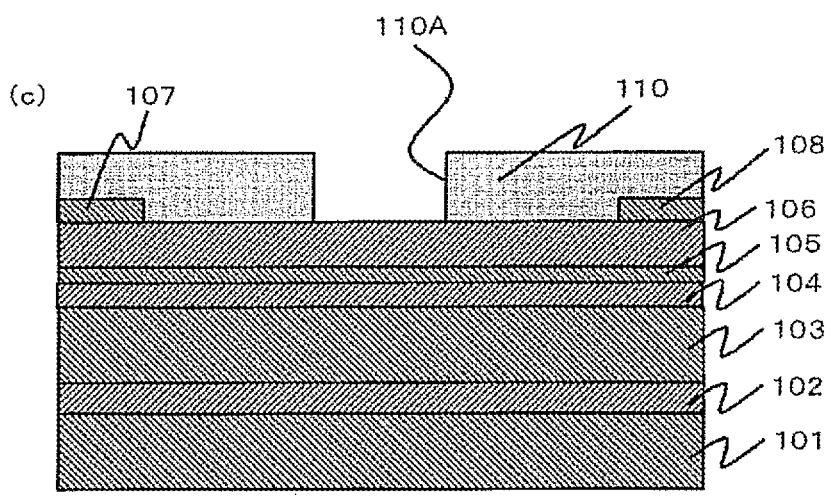
Figure 3:
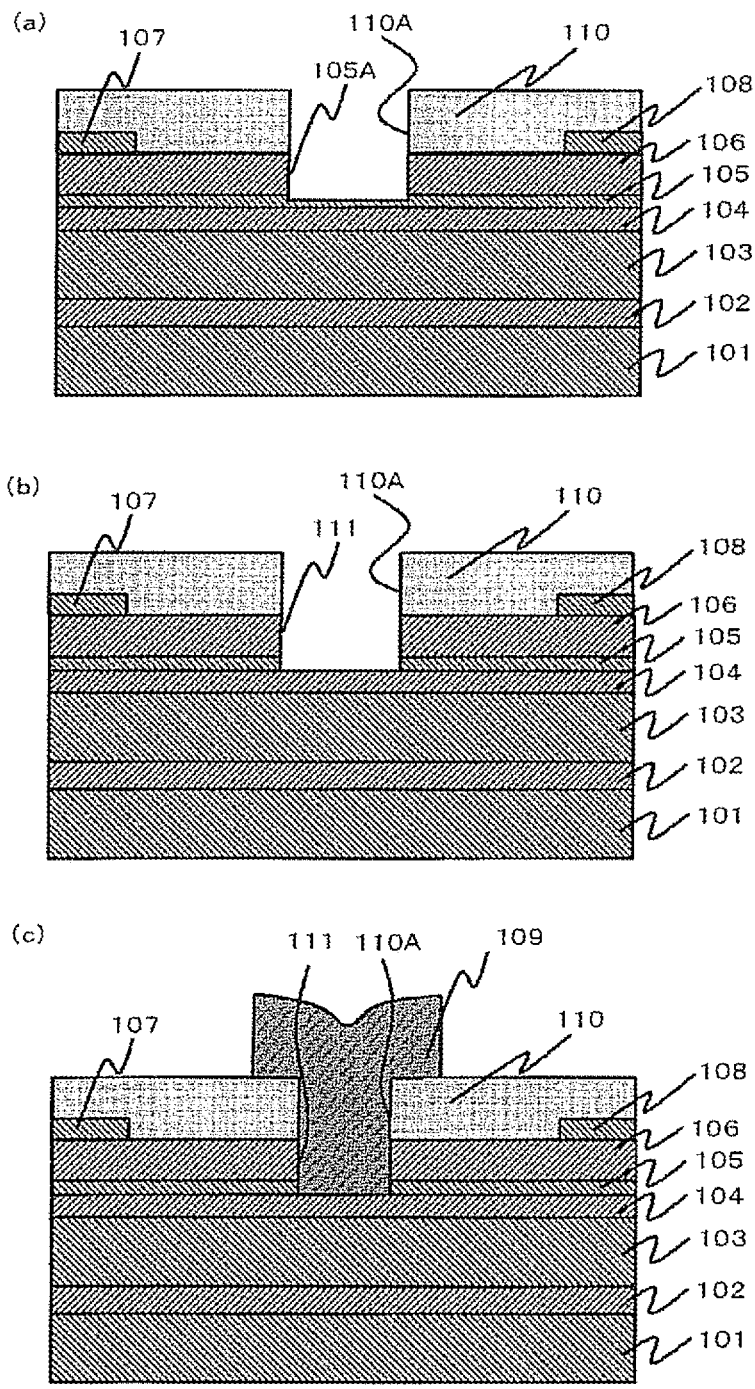
FIG. 3 includes cross-sectional views, illustrating a manufacturing process of a field effect transistor.

A field effect transistor according to first embodiment will be described in reference to FIG. 1 to FIG. 3. In the beginning, an overview of the field effect transistor of the present embodiment will be described in reference to FIG. 1. FIG. 1 is a cross-sectional view, which schematically illustrates a structure of a field effect transistor according to first embodiment. The field effect transistor of the present embodiment includes: a channel layer 103 containing gallium nitride (GaN) or indium gallium nitride (InGaN) as a major constituent; a first electron-supplying layer, disposed on or over the channel layer 103 and containing $In_xAl_yGa_{1-x-y}N$ ($0 \leq x < 1$, $0 < y < 1$, $0 < x+y < 1$) as a major constituent; a first etch stop layer (first layer) 105, disposed on or over the first electron-supplying layer 104 and containing indium aluminum nitride (InAlN) as a major constituent; a second electron-supplying layer 106, provided on or over the first etch stop layer 105 and containing $In_aAl_bGa_{1-a-b}N$ ($0 \leq a < 1$, $0 < b < 1$, $0 < a+b < 1$) as a major constituent; a source electrode 107 and a drain electrode 108, provided on or over the second electron-supplying layer 106 and disposed separately from each other; and a gate electrode 109 provided between the source electrode 107 and the drain electrode and 108. The second electron-supplying layer 106 and the first etch stop layer 105 are provided with a first recess 111, which extends through thereof and has a bottom surface constituted of a surface of the first electron-supplying layer 104.

The gate electrode 109 covers the bottom surface of the first recess 111, and is disposed in the aforementioned first recess 111.

The second electron-supplying layer 106 covers the whole of the regions of an interface between the first electron-supplying layer 104 and the channel layer 103 except a region thereof under the bottom surface of the first recess 111 covered by the gate electrode 109, in plan view from the side of each of the surfaces of the layers (in other words, in plan view from the side of the substrate face of the substrate 101). Here, the region thereof under the bottom surface of the first recess 111 covered by the gate electrode 109 means a region right under a section covered with the gate electrode and regions within a range of several hundred angstroms from such region right under the section along the two-dimensional direction of the layer. More specifically, this includes the region right under the section covered with the gate electrode and the region where no increase of the ON-resistance without being covered with the second electron-supplying layer.

Such field effect transistor achieves substantially "zero" of electron density of electron existing in the region of the channel layer 103 under the gate electrode 109 when the gate voltage $V_G$ applied to the gate electrode 109 is: $V_G=0$ V, and thus allows achieving so-called "normally off" condition. Assume that the gate voltage $V_G$ applied to the gate electrode 109 is positive, a condition is achieved that the two-dimensional electron gas is induced and accumulated in the region of the interface with the first electron-supplying layer 104 and channel layer 103 under the gate electrode 109, achieving "ON-state". More specifically, an enhancement (normally off) type field effect transistor can be achieved.

In the next, the field effect transistor of the present embodiment will be described in detail. The field effect transistor includes the above-described channel layer 103, the first electron-supplying layer 104, the first etch stop layer 105, the second electron-supplying layer 106, the source electrode 107, the drain electrode 108, the gate electrode 109, and in addition, a substrate 101, a buffer layer 102, and a first insulating film 110.

Figure 8:
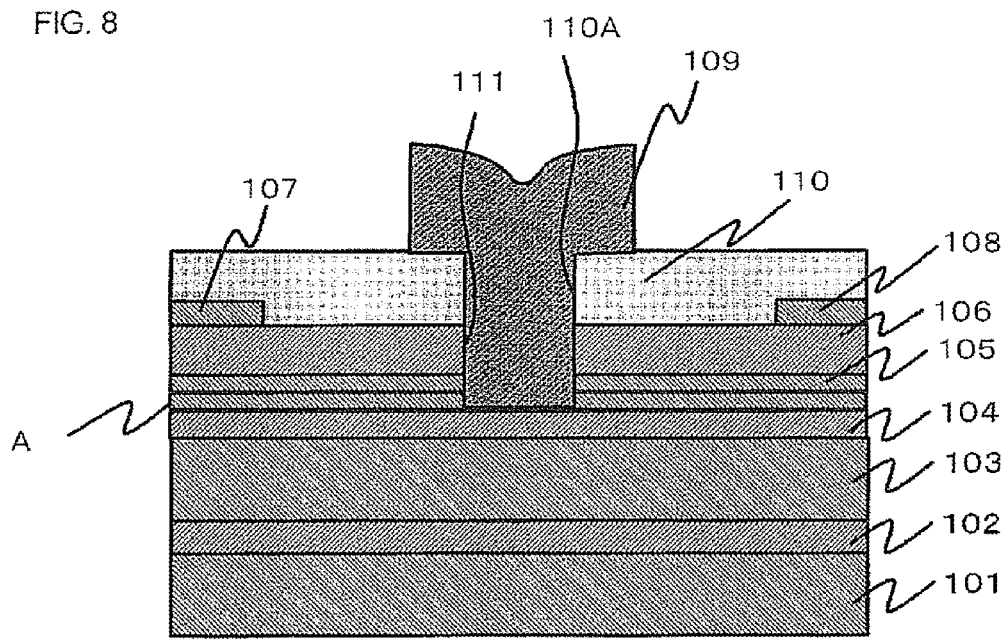
FIG. 8 is a cross-sectional view of a field effect transistor according to first embodiment.

In addition to above, an intermediate layer A having a thickness of equal to or larger than 0.5 nm and equal to or smaller than 10 nm (within a range of from 0.5 nm to 10 nm) and composed of GaN (composed of GaN as a major constituent) may be formed between the first electron-supplying layer 104 and the first etch stop layer 105 (see FIG. 8). In such case, the first recess 111 extends through the intermediate layer A.

The substrate 101 may be, for example, a GaN substrate, and the buffer layer 102 is made of GaN. In addition to above, a sapphire substrate, an SiC substrate or an Si substrate may be employed for the substrate 101. In addition, the material for the buffer layer 102 is not limited to GaN. The buffer layer 102 is deposited on the substrate 101. In the present embodiment, the channel layer 103 composed of GaN and having a thickness of 1 μm, the first electron-supplying layer 104 composed of undoped $Al_{0.2}Ga_{0.8}N$ and having a thickness of 5 nm, the first etch stop layer 105 composed $In_{0.17}Al_{0.83}N$ and having a thickness of 5 nm, and the second electron-supplying layer 106 composed of undoped $Al_{0.2}Ga_{0.8}N$ and having a thickness of 25 nm, are epitaxially grown over the buffer layer 102 to form a multiple-layered structure. In addition to above, the thickness and the content ratio of each layer are presented for the illustration only, and are not limited to those described above.

The Al content ratio in the first electron-supplying layer 104 may be equal to or lower than 30%, and preferably equal to or higher than 15% and equal to or lower than 25%, and the Al content ratio of the first etch stop layer 105 may be equal to or higher than 80%, and preferably equal to or higher than 81% and equal to or lower than 85%, which allows lattice match with GaN.

In the present embodiment, the Al content ratio of the first electron-supplying layer 104 is 20%, and the Al content ratio of the first etch stop layer 105 is 83%. As described above, increased difference between the Al content ratio of the first electron-supplying layer 104 and the Al content ratio of the first etch stop layer 105 allows larger selectivity in the wet etching process as discussed later. In addition, the thickness of the first electron-supplying layer 104 is uniform, and the thickness of the section right under the first recess 111 is equivalent to the thickness of the other sections. More specifically, substantially no etching is caused in the first electron-supplying layer 104, when the first recess 111 is formed.

In addition, the thickness of the first etch stop layer 105 may be preferably 0.5 to 5 nm. A differential in the conduction band edge energy $E_c$ (band offset: $\Delta E_c$) is present in the interface of the first and the second electron-supplying layers 104 and 106 composed of AlGaN with the first etch stop layer 105 contacting thereto to create a potential barrier with higher energy in the first etch stop layer 105, which may be a factor for increasing an access resistance between the two-dimensional electron gas and the source and the drain electrodes 107 and 108. Such increased access resistance can be eliminated by controlling the thickness of the first etch stop layer 105 to equal to or lower than 5 nm to sufficiently enhance the tunneling current passing beyond a potential barrier. On the other hand, it is preferable to have the thickness of the first etch stop layer 105 to be 0.5 nm or larger, in order to exhibiting the stopping function for the etching process for forming the first recess 111, as will be discussed later in detail.

In the field effect transistor of the present embodiment, the configuration of depositing the first electron-supplying layer 104 composed of AlGaN and the first etch stop layer 105 composed of InAlN over the channel layer 103 composed of GaN or InGaN is adopted. A lattice mismatch is present between GaN or InGaN of the channel layer 103 and the first electron-supplying layer 104, and a lattice mismatch is also present between the electron-supplying layer 104 and InAlN of the first etch stop layer 105. Therefore, it is preferable to design that the total thickness of AlGaN of the first electron-supplying layer 104 does not exceed the critical thickness defined by the lattice mismatch. In such configuration, suitable Al composition for creating lattice match with GaN may be selected as described above and thinner thickness of 0.5 to 5 nm may be selected for InAlN composing of the first etch stop layer 105, so that InAlN is not influential to the critical thickness of AlGaN of the first electron-supplying layer 104. The thickness of the first electron-supplying layer 104 composed of AlGaN may be preferably controlled within a range of from 2 to 15 nm. This ensures the two-dimensional electron gas right under the gate electrode disappearing under the condition that the gate voltage $V_G=0$ V is applied.

The thickness of the second electron-supplying layer 106 is suitably selected so as not to cause a disappearance of the two-dimensional electron gas accumulated in regions of the interface with the first electron-supplying layer 104 and channel layer 103 except the section of the first recess.

Further, the Al composition (b) of AlGaN composing the second electron-supplying layer 106 may be preferably equal to or larger than the Al composition (y) of AlGaN composing the first electron-supplying layer 104. In the present embodiment, the Al composition (b) of AlGaN composing the second electron-supplying layer 106 may be preferably equal to the Al composition (y) of AlGaN composing the first electron-supplying layer 104. Taking b as equal to or larger than y ensures the two-dimensional electron gas to be generated in the regions except the first recess 111, achieving lower ON-resistance. Further, larger b as compared with y provides higher concentration of the two-dimensional electron gas in the regions except the first recess 111, achieving reduced resistance in these regions. In this regard, excessively larger b would provide increased contact resistance with the source electrode 107 and the drain electrode 108, which are formed on the surface of the second electron-supplying layer 106. In order to achieve the field effect transistor with lower ON-resistance, b may be controlled within a range of from 5% to 35%, and more preferably within a range of from 20% to 30%. In addition to above, the Al composition (y) of the first electron-supplying layer 104 may be preferably within a range of from 15% to 25%, in view of obtaining the two-dimensional electron gas with sufficiently higher concentration in the channel layer and in view of obtaining the two-dimensional electron gas with sufficiently higher mobility.

The source electrode 107 and the drain electrode 108 are formed on the second electron-supplying layer 106, and these are separately arranged. The T-shaped gate electrode 109 is disposed between the source electrode 107 and the drain electrode 108.

The first recess 111 is formed by partially etching sections of the second electron-supplying layer 106 and the first etch stop layer 105 in the region between the source electrode 107 and the drain electrode 108 to expose the first electron-supplying layer 104. The first recess 111 extends through the second electron-supplying layer 106 and the first etch stop layer 105, and has side surfaces composed of the second electron-supplying layer 106 and the first etch stop layer 105, and also has the bottom surface composed of the first electron-supplying layer 104. The width of the first recess 111 is substantially uniform and constant from the side of the bottom to the side of the top (opening side). More specifically, the first recess 111 has a rectangular geometry in the cross-section perpendicular to the surface of each layer (cross section along the direction of depositing the layers), and the width of the bottom surface, the width between the side surfaces constituted of the second electron-supplying layer 106, and the width between the side surfaces constituted of the first etch stop layer 105 are substantially equivalent. In addition, the first recess 111 has a rectangular geometry in plan view.

In such case, the condition that the width of the first recess 111 is substantially constant includes not only the condition that the width of the bottom surface of the first recess 111, the width between the side surfaces constituted of the second electron-supplying layer 106, and the width between the side surfaces constituted of the first etch stop layer 105 are exactly the same, but also includes a condition that the width between the side surfaces constituted of the first etch stop layer 105 is slightly larger than the width of the bottom surface of the first recess 111 and than the width between the side surfaces constituted of the second electron-supplying layer 106. More specifically, the width between the side surfaces constituted of the first etch stop layer 105 may be slightly larger than the width of the bottom surface of the first recess 111 and than the width between the side surfaces constituted of the second electron-supplying layer 106, to the extent that the high resistance region without the two-dimensional electron gas is not formed in the ON-state. A discrete structure with a spacing, in which the first etch stop layer 105 is not in contact with the gate electrode 109, may be provided by utilizing the stopping function for the etching process via a wet etching process as discussed later to slightly over-etching the first etch stop layer 105 composed of InAlN.

A spacing between the gate electrode 109 and the first etch stop layer 105 may be possibly constitutes a high resistance region without the two-dimensional electron gas, similarly as in the conventional technology. However, since the first etch stop layer 105 is very thin, namely 0.5 to 5 nm, the spacing formed by the over-etching process may be easily controlled to have very smaller dimension of, for example, equal to or smaller than 0.1 μm. Therefore, the presence of such spacing would avoid a formation of a high resistance region without the two-dimensional electron gas.

Further, in such structure including a spacing, the access resistance between the two-dimensional electron gas and the source electrode 107 and the drain electrode 108 can be reduced without increasing the gate leakage current increase, by doping with n-type impurity in the first etch stop layer 105. This is because the doping with n-type impurity causes a decrease in the potential barrier created in the first etch stop layer 105.

Preferable doping level of n-type impurity may be controlled within a range of from $5 \times 10^{18}$ cm$^{-3}$ to $1 \times 10^{19}$ cm$^{-3}$.

The gate electrode 109 is composed of nickel/gold (Ni/Au), and, in the present embodiment, is in direct contact with the entire side surface and the entire bottom surface of the first recess 111. In other words, the gate electrode 109 is formed so as to be plugged into the first recess 111 without a clearance therebetween. The gate electrode 109 has a T-shape geometry in the cross section, which is composed of a cross-sectional rectangular section embedded in the first recess 111 and a visor section connected to the top of such cross-sectional rectangular section.

The first insulating film 110 is provided on or over the second electron-supplying layer 106 to cover the regions except the first recess 111. The first insulating film 110 covers the second electron-supplying layer 106, the source electrode 107, and the drain electrode 108. The first insulating film 110 also includes an opening 110A, which extends through the first insulating film 110, and is in communicate with the first recess 111. The gate electrode 109 is buried in the opening 110A. In addition to above, the visor section of the T-shape gate electrode 109 is located above the first insulating film 110. The first insulating film 110 is composed of, for example, silicon nitride (SiN) of 200 nm.

Next, a process for manufacturing the field effect transistor shown in FIG. 1 will be described in reference to FIG. 2 and FIG. 3. In the beginning, the buffer layer 102, the channel layer 103 composed of GaN and having a thickness of 1 μm, the first electron-supplying layer 104 composed of undoped Al$_{0.2}$Ga$_{0.8}$N and having a thickness of 5 nm, the first etch stop layer 105 composed of In$_{0.17}$Al$_{0.83}$N and having a thickness of 5 nm, and the second electron-supplying layer 106 composed of undoped Al$_{0.2}$Ga$_{0.8}$N and having a thickness of 25 nm, are epitaxially grown over the substrate 101 in this sequence via a metal organic vapor phase epitaxy (MOVPE). This can obtain a layered structure of a nitride semiconductor (FIG. 2(a)).

Next, titanium/aluminum (Ti/Al) (30/180 nm) electrode is formed on a predetermined position of the surface of the second electron-supplying layer 106 by employing a deposition and lift-off process. Then, a rapid thermal anneal (RTA) process is conducted at 700 degrees C. for 60 seconds to obtain the source electrode 107 and the drain electrode 108 (FIG. 2(b)).

The first insulating film 110 composed of SiN and having a thickness of 200 nm is deposited on the entire surface of the second electron-supplying layer 106 via a plasma chemical vapor deposition (plasma CVD) process. Then a photo resist mask is formed in a location corresponding to the location for providing the first recess 111, between the source electrode 107 and the drain electrode 108. Such photo resist mask has an opening pattern, which is associated with the two-dimensional geometric pattern of the first recess 111. The photo resist mask is utilized to selectively etch the first insulating film 110 composed of SiN by employing a reactive ion etching (RIE) process to form the opening 110A (FIG. 2(c)). Sections of the second electron-supplying layer 106 and the first etch stop layer 105 are selectively removed through a mask of the first insulating film 110 by employing an inductively coupled plasma (ICP) dry etching process (FIG. 3(a)). This provides a hole 105A having a bottom surface constituted of a section of the first etch stop layer 105.

Next, the sections of the first etch stop layer 105 remained on the bottom surface of the hole 105A is selectively stripped via a wet etching process employing potassium hydroxide (KOH) aqueous solution to expose the first electron-supplying layer 104, thereby forming the first recess 111 (FIG. 3(b)). Then, Ti/A (30/300 nm) is formed to fill the first recess 111 by employing a deposition and lift-off process. As a result, the cross-sectional geometry of the patterned Ni/Au (30/300 nm) is presented as T-shape, so that the T-shape gate electrode 109 is obtained to complete the field effect transistor (FIG. 3(c)). In addition to above, when the intermediate layer composed of the above-described GaN is formed, the above-described intermediate layer may be formed on the first electron-supplying layer, and then the first etch stop layer may be provided.

Next, advantageous effects of the present embodiment will be described. In the configuration of the field effect transistor according to first embodiment, the process for forming the first recess 111 includes partially removing the first etch stop layer 105 via a dry etching process, and then stripping the remained section of the first etch stop layer 105 via a wet etching process, so that the threshold value bias $V_{th}$ of transistor can be controlled with higher accuracy. This is because the following reasons. Since the etch rate ratio (so-called selectivity) over the second electron-supplying layer 106 composed of AlGaN and the first etch stop layer 105 composed of InAlN is lower, namely about 50 to 80, in the case of the dry etching process, the etching is not stopped at the surface of the first etch stop layer 105, and a section thereof is etched off. On the other hand, since the selectivity over the first etch stop layer 105 composed of InAlN and the first electron-supplying layer 104 composed of AlGaN is higher, namely 2,00 or higher, in the wet etching process after the dry etching process, the etching is stopped with higher accuracy at the surface of the first electron-supplying layer 104. Since the threshold bias $V_{th}$ of the field effect transistor is determined by the thickness of the electron-supplying layer 104 composed of AlGaN right under the gate electrode formed on the etching bottom surface, the ability to stop the etching with higher accuracy means a controllability of the threshold bias $V_{th}$ with higher accuracy.

Further, if an intermediate layer composed of GaN is formed between the first electron-supplying layer 104 and the first etch stop layer 105, considerably larger selectivity over the first electron-supplying layer 104 and the intermediate layer can be achieved, so that the etch stop accuracy can be improved.

In addition, an insertion of the intermediate layer composed of GaN provides larger threshold bias $V_{th}$, as compared with the configuration, in which the thickness of the first electron-supplying layer is the same and there is no intermediate layer. This allows reducing the leakage current in the OFF-state.

However, since the intermediate layer composed of GaN functions as increasing the ON-resistance by reducing the two-dimensional electron gas in the region except the first recess, it is preferable to select the thickness of the intermediate layer composed of GaN within a range of from 0.5 to 5 nm, in order to achieve the enhancement (normally off) type field effect transistor with reduced ON-resistance.

While the standard deviation of the variation in the threshold bias $V_{th}$ over the wafer surface ($\sigma(V_{th})$) is equal to or higher than 300 mV in the case of forming the recess by the conventional thermal oxidation process or the dry etching process, the field effect transistor according to the present embodiment (FIG. 1) achieves $\sigma(V_{th})$ of 60 mV, which means that the variation is reduced to equal to or lower than 1/5. Further, when an intermediate layer composed of GaN having a thickness 5 nm is inserted between the first electron-supplying layer 104 and the first etch stop layer 105, the $\sigma(V_{th})$ is reduced to 40 mV.

In addition, in the field effect transistor of the present embodiment, the gate electrode 109 is buried in the first recess 111 without a clearance. More specifically, in view from the side of the surface of the substrate 101, the whole other region of the interface between the first electron-supplying layer 104 and the channel layer 103 except the region right under the bottom surface of the first recess 111 of the first electron-supplying layer 104 that is in contact with the aforementioned gate electrode 109 overlaps with the second electron-supplying layer 106. Therefore, there is no region of causing a disappearance of the two-dimensional electron gas in the "ON-state", in which a gate voltage $V_G$ is positively biased to achieve the condition of: $V_G > V_{th}$.

While the "ON-resistance" in the conventional recess structure field effect transistor is about 5.5 Ωmm, the "ON-resistance" in the field effect transistor according to first embodiment is 2.3 Ωmm, achieving a reduction by equal to or lower than one-half of that of the conventional device. Further, when an additional configuration is adopted, in which an n-type impurity of Si is injected in the first etch stop layer 105 at a concentration of $4 \times 10^{19}$ cm$^{-3}$ and a clearance of 20 nm=0.02 μm is provided between the T-shape gate electrode 109 and the first etch stop layer 105, the ON-resistance can be reduced to 1.8 Ωmm.

Since the thickness of the first electron-supplying layer 104 is smaller in the section right under the bottom surface of the first recess 111, the field effect transistor is in the OFF-state in the condition of the gate voltage $V_G = 0$ V. The threshold bias $V_{th}$ of the gate for achieving the ON-state of the field effect transistor is $V_{th} = +0.5$ V, and therefore the enhancement (normally off) type field effect transistor of is obtained.

Both of the first electron-supplying layer 104 and the second electron-supplying layer 106 are composed of AlGaN, and the Al composition in the second electron-supplying layer 106 is equal to or larger than the others. This allows advantageously providing lower ON-resistance even if the field effect transistor is the enhancement (normally off) type.

Second Embodiment

Figure 4:
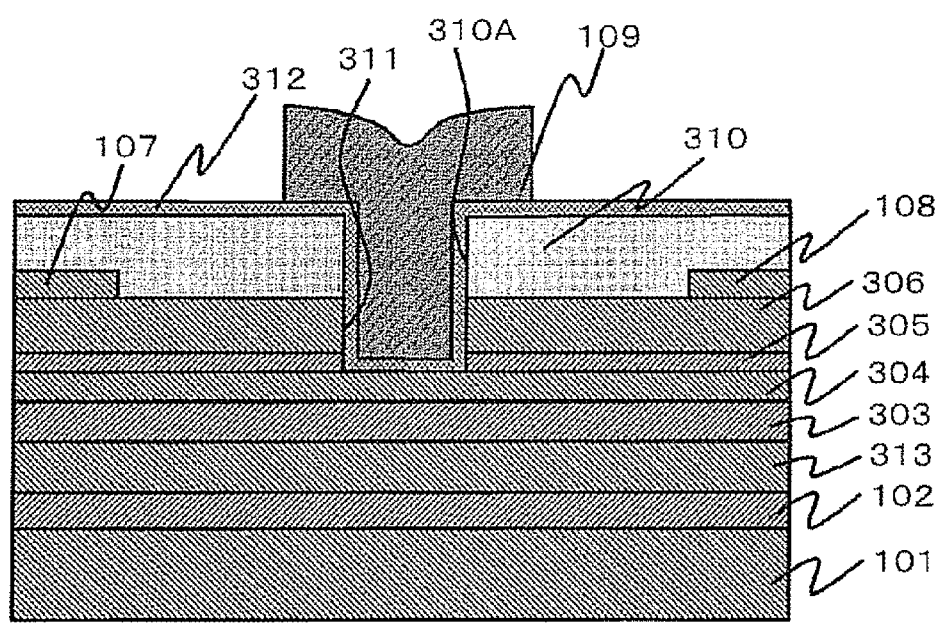
FIG. 4 is a cross-sectional view of a field effect transistor according to second embodiment of the present invention.

In the next, second embodiment of the present invention will be described in reference to FIG. 4.

While the above-described embodiment is related to the Schottky gate structure, in which the T-shape gate electrode 109 is formed to be in Schottky contact with the first electron-supplying layer 104, the present embodiment involves a metal insulator semiconductor (MIS) gate structure, in which a gate insulating film 312 is formed between a T-shape gate electrode 109 and a first electron-supplying layer 304.

An example of a field effect transistor having a MIS gate structure according to second embodiment will be described in reference to FIG. 4 as follows. A nitride semiconductor utilized in the field effect transistor according to second embodiment has the following layer structure. A buffer layer 102, a second buffer layer 313 composed of GaN and having a thickness of 1 μm, an channel layer 303 composed of $In_{0.05}Ga_{0.95}N$ and having a thickness of 15 nm, a first electron-supplying layer 304 composed of undoped $Al_{0.17}Ga_{0.83}N$ and having a thickness of 5 nm, a first etch stop layer (first layer) 305 composed of $In_{0.17}Al_{0.83}N$ doped with an n-type impurity of Si at a concentration of $5 \times 10^{19}$ cm$^{-3}$ and having a thickness of 5 nm, and a second electron-supplying layer 306 composed of undoped $Al_{0.25}Ga_{0.75}N$ and having a thickness of 25 nm, are epitaxially grown on or over a substrate 101 in this order to form a multiple-layered structure. A source electrode 107 and a drain electrode 108 are formed on the second electron-supplying layer 306. The T-shape gate electrode 109 is provided between the source electrode 107 and the drain electrode 108. Here, the thickness and the content ratio of each of the layers are only for the illustration, and it is not intended to particularly limit the above-described values. In addition, the preferable thickness and the preferable composition of each of the layers are similar to those in the former embodiment. In addition, the thickness of the first electron-supplying layer 304 is constant, and thus the thickness of a section right under the first recess 311 is equivalent to the thickness of the other sections. This means that substantially no etching is caused in the first electron-supplying layer 304 when the first recess 311 is formed.

The first recess 311 has a structure, which is similar to the structure of the first recess 111 in the former embodiment, and more specifically, the first recess 311 extends through the second electron-supplying layer 306 and the first etch stop layer 305, and has side surfaces composed of the second electron-supplying layer 306 and the first etch stop layer 305, and also has the bottom surface composed of the first electron-supplying layer 304. The shape of the first recess 311 is similar to the shape of the first recess 111 of in first embodiment, and in the cross section along direction for depositing each layer, the width of the first recess 311 is substantially uniform and constant from the side of the bottom to the side of the top. The first recess 311 is formed between the source electrode 107 and the drain electrode 108. A first insulating film 310 composed of SiON and having a thickness of 200 nm is formed on region of the second electron-supplying layer 306 except the first recess 311. The first insulating film 310 covers the second electron-supplying layer 306, the source electrode 107, and the drain electrode 108. In addition, the first insulating film 310 is provided with an opening 310A, which extends through the first insulating film 310, and is in communicate with the first recess 311. The gate electrode 109 is buried in the opening 310A. In addition to above, the visor section of the T-shape gate electrode 109 is located above the first insulating film 310. In addition, a gate insulating film 312 composed of aluminum oxide ($Al_2O_3$) and having a thickness of 30 nm is formed within the first recess 311 and on the first insulating film 310, and a cross-sectional rectangular section of the T-shape gate electrode 109 is formed so as to fill the inside of the first recess 311 and the opening 310A without forming a clearance. The gate electrode 109 is in contact with the entire side surface and the entire bottom surface of the first recess 311 and with the inner surface of the opening 310A via the gate insulating film 312.

While such field effect transistor is manufactured by a process similar to that for manufacturing the field effect transistor of the above-described embodiment, the process additionally includes an operation for providing a gate insulating film 312 in the first recess 311 so as to cover the above-described bottom surface and the above-described side surface of the first recess 311 before forming the gate electrode 109.

According to the present embodiment, the following advantageous effects can be achieved, in addition to the advantageous effects obtainable in first embodiment. The field effect transistor of the present embodiment adopts the MIS gate structure, so that the concentration of the two-dimensional electron gas right under the T-shape gate electrode is increased as compared with the Schottky gate structure, when the transistor is in the ON-state. In addition, the Al composition of the second electron-supplying layer 306 is selected to be larger than the Al composition of the first electron-supplying layer 304, so that the concentration of the two-dimensional electron gas in the region except the first recess 311 is increased. Further, the first etch stop layer 305 is doped with n-type impurity so that the access resistance between the two-dimensional electron gas and the source and the drain electrodes 107 and 108 is reduced. These advantageous effects allow the field effect transistor in second embodiment exhibiting reduced ON-resistance of 1.5 Ωmm.

Further, an n-type impurity of Si is injected in a region of 5 nm thick from the surface of the second electron-supplying layer 306 at a concentration of $4 \times 10^{19}$ cm$^{-3}$, so that the contact resistance with the source electrode 107 and the drain electrode 108 is reduced, resulting in providing a reduced ON-resistance of the field effect transistor of 1.1 Ωmm. In addition to above, since the gate insulating film 312 is present between the first etch stop layer 305 and the second electron-supplying layer 306 and the T-shape gate electrode 109 in the field effect transistor of the second embodiment and thus no direct contact is caused therebetween, no increase of the gate leakage current due to a doping of the first etch stop layer 305 or the second electron-supplying layer 306 with an n-type impurity is caused.

Figure 6:
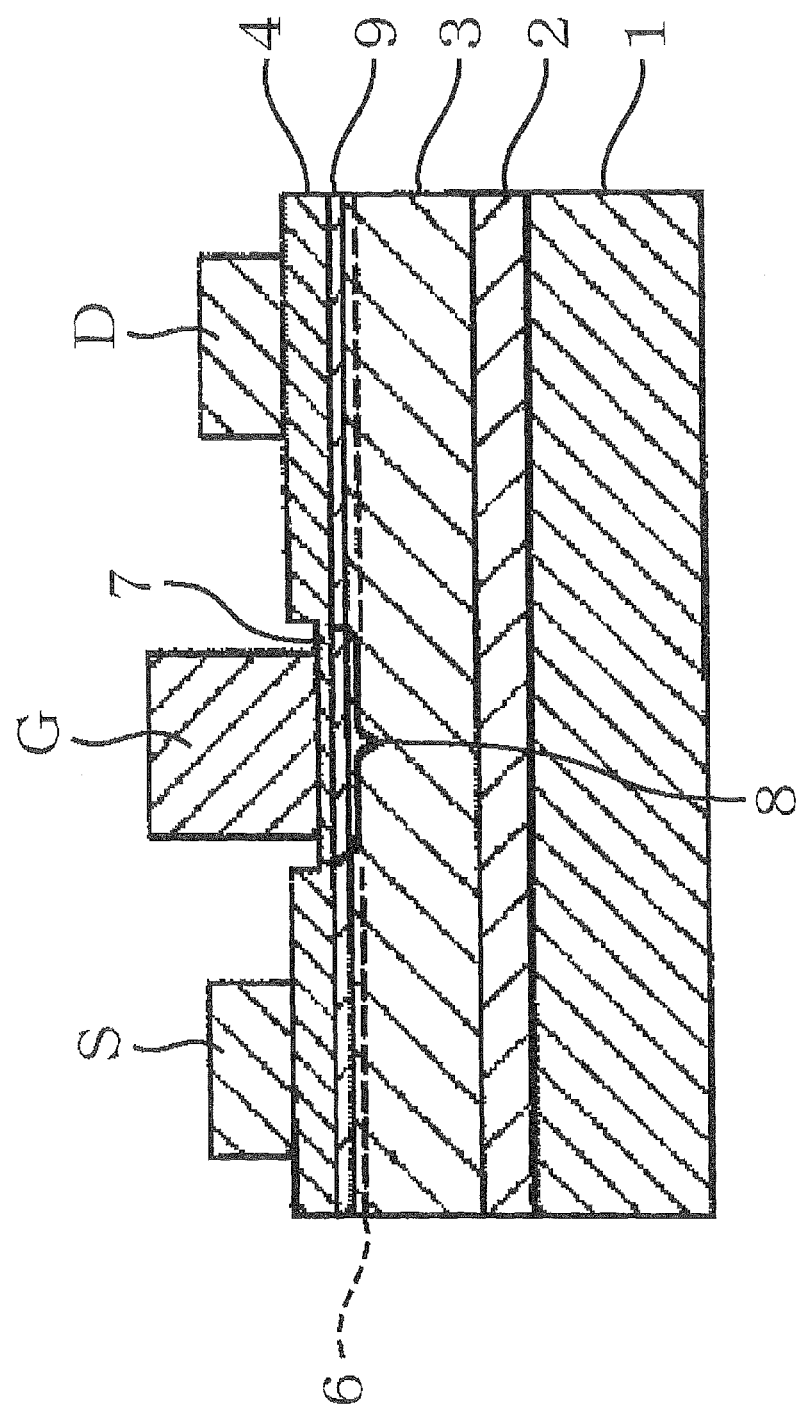
FIG. 6 is a cross-sectional view, illustrating a conventional field effect transistor.
Figure 7:
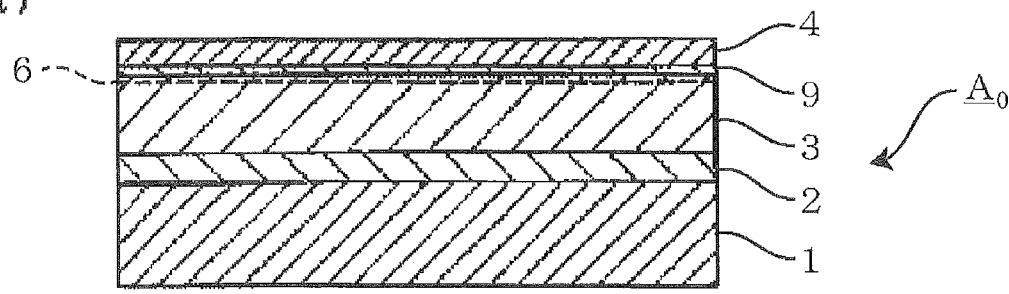
FIG. 7 includes cross-sectional views, illustrating a process for manufacturing a conventional field effect transistor.
Figure 7:
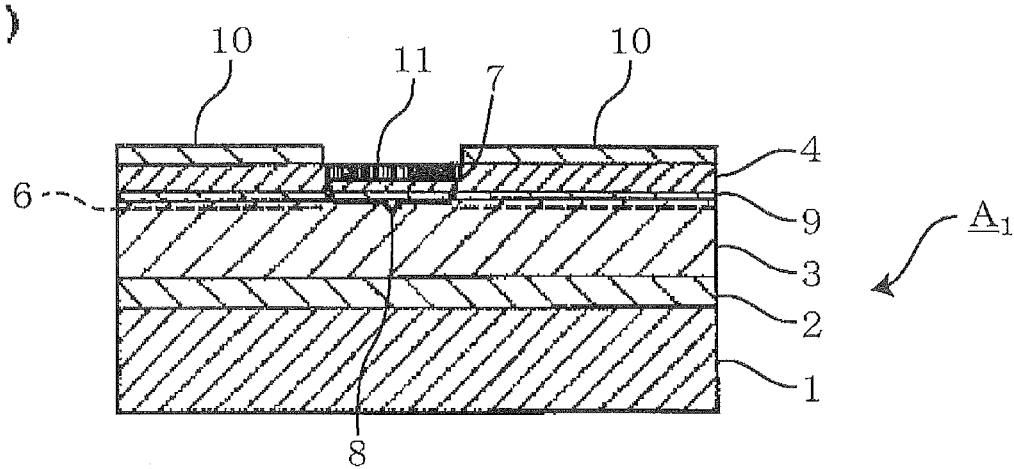
Figure 7:
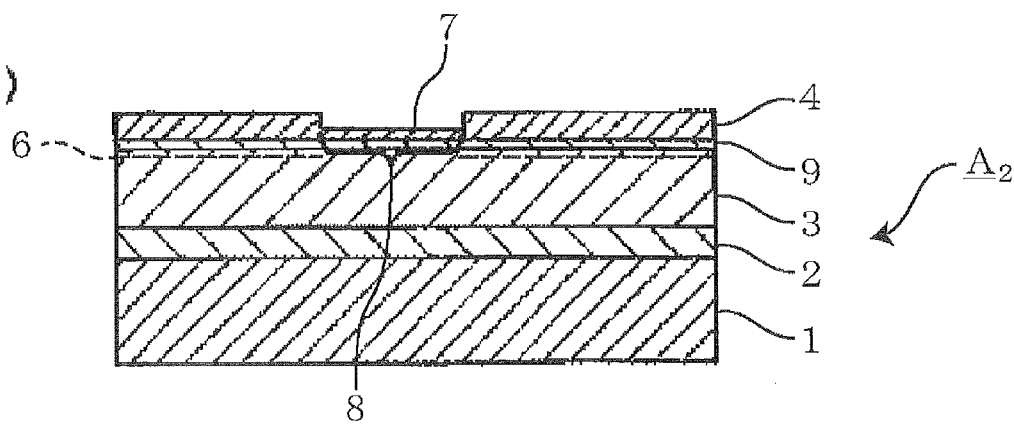

Here, in the structure shown in FIG. 6, the electron-supplying layer 4 provided with the source electrode S and the drain electrode D is formed is composed of $Al_{0.2}Ga_{0.8}N$ without doping with n-type. The present inventors have conducted investigations on the configuration having a source electrode S and a drain electrode D provided on the surface of $Al_{0.2}Ga_{0.8}N$ without n-type doping. A combination of Al/Ti/Au is employed for the source electrode S and the drain electrode D. The investigations by the present inventors show that the access resistance between the two-dimensional electron gas 6 and the source electrode S or the drain electrode D is about 1 Ωmm, and lower resistance than this value cannot be obtained.

Besides, an approach for providing a doped contact layer with higher concentration between the source and drain electrodes S and D and the electron-supplying layer 4 may be considered for the purpose of reducing the contact resistance in reducing the ON-resistance in the operation. Japanese Patent Laid-Open No. 2005-183,733 discloses a configuration for utilizing a nitride semiconductor of n-GaN layer doped with an n-type impurity at an increased concentration of about $1 \times 10^{19}$ cm$^{-3}$ for a contact layer. However, while such configuration achieves an advantageous effect of reducing the contact resistance between the contact layer and the source electrode S or the drain electrode D, the configuration cannot provide effective reduction of the access resistance between the two-dimensional electron gas 6 and the source electrode S or the drain electrode D by the following reasons.

When an n-GaN layer is provided as a contact layer, a piezoelectric field is generated in the AlGaN that serves as the electron-supplying layer 4, due to a piezoelectric effect on the basis of a crystal distortion, achieving a condition equivalent to that a negative polarized charge is generated in an interface with the electron-supplying layer 4 and the contact layer. Such negative polarized charge allows increasing an energy potential in the bottom end of the conduction band in the interface with the AlGaN serving as the electron-supplying layer 4 and the n-GaN serving as the contact layer, creating a high potential barrier for electron. Therefore, electron is hard to pass through such high potential barrier between the two-dimensional electron gas 6 and the source electrode S or the drain electrode D, which is a factor for the increase in the resistance. Such increase in the resistance cancels the advantageous effect of reducing the contact resistance with the source electrode S or the drain electrode D by employing the contact layer composed of n-GaN.

Indeed, a configuration of providing a contact layer composed of n-GaN between the electron-supplying layer 4 composed of $Al_{0.2}Ga_{0.8}N$ without doping with n-type impurity and the source and the drain electrodes S and D is investigated. In the investigation of the present inventors, the access resistance between the two-dimensional electron gas 6 and the source electrode S or the drain electrode D is 1.5 Ωmm, and therefore it is found that the access resistance is increased as compared with the access resistance in the case of being provided with the above-described contact layer. On the contrary, the first etch stop layer 305 is doped with an n-type impurity in the present embodiment, so that the access resistance between the two-dimensional electron gas and the source and the drain electrodes 107 and 108 is reduced, and in addition, the second electron-supplying layer 306 is doped with an n-type impurity, so that the contact resistance with the source electrode 307 and the drain electrode 308 can be reduced.

Further, in the present embodiment, the gate electrode 109 is in contact with the second electron-supplying layer 306 through the gate insulating film 312. Therefore, the interface with the first electron-supplying layer 304 and the channel layer 303 right under the gate insulating film 312 is not covered with the second electron-supplying layer 306. However, since the thickness of the gate insulating film 312 is generally very smaller, generation of a region in the interface with the first electron-supplying layer 304 and the channel layer 303 where the second electron gas disappears in the ON-state can be inhibited. In addition to above, the thickness of the gate insulating film 312 may preferably be equal to or lower than 100 nm in view of preventing the disappearance of the second electron gas in the ON-state. Further, in view of assuring the sufficiently higher gate breakdown voltage, the thickness of the gate insulating film 312 may preferably be equal to or higher than 10 nm.

Third Embodiment

A field effect transistor of the present embodiment will be described in reference to FIG. 5. In the present embodiment, a second recess 416 in communication with the first recess 411 is formed. A nitride semiconductor utilized in a field effect transistor according to third embodiment has the following layer structure. A buffer layer 102, a second buffer layer 413 composed of GaN and having a thickness of 1 μm, a channel layer 403 composed of $In_{0.05}Ga_{0.95}N$ and having a thickness of 15 nm, a first electron-supplying layer 404 composed of undoped $Al_{0.17}Ga_{0.83}N$ and having a thickness of 5 nm, a first etch stop layer (first layer) 405 composed of $In_{0.17}Al_{0.83}N$ doped with an n-type impurity of Si at a concentration of $5 \times 10^{19}$ cm$^{-3}$ and having a thickness of 5 nm, a second electron-supplying layer 406 composed of undoped $Al_{0.2}Ga_{0.8}N$ and having a thickness of 25 nm, a second etch stop layer (the second layer) 414 composed of $In_{0.17}Al_{0.83}N$ doped with an n-type impurity of Si at a concentration of $8 \times 10^{19}$ cm$^{-3}$ and having a thickness of 5 nm, and a third electron-supplying layer 415 composed of $Al_{0.25}Ga_{0.75}N$ doped with an n-type impurity of Si at a concentration of $5 \times 10^{19}$ cm$^{-3}$ and having a thickness of 6 nm, are epitaxially grown on or over a substrate 101 in this order to form a multiple-layered structure. The source electrode 107 and the drain electrode 108 are provided on the third electron-supplying layer 415 and are separately arranged. The T-shaped gate electrode 109 is disposed between the source electrode 107 and the drain electrode 108. The gate electrode 109 is provided within the first recess 411 and the second recess 416.

Here, the thickness and the content ratio of each of the layers are only for the illustration, and it is not intended to particularly limit the above-described values. In addition, the preferable thickness and the preferable composition of each of the layers are similar to those in the former embodiment. In addition, the thickness of the first electron-supplying layer 404 is constant, and thus the thickness of a section right under the first recess 411 is equivalent to the thickness of the other sections. This means that substantially no etching is caused in the first electron-supplying layer 404 when the first recess 411 is formed.

In addition, the Al composition of the third electron-supplying layer 415 is equivalent to or larger than the Al composition of AlGaN of the second electron-supplying layer 406. This allows providing increased concentration of the two-dimensional electron gas. The whole body of, or a section in the side of the surface of, the third electron-supplying layer 415 may be preferably doped with an n-type impurity at a concentration within a range of from $5 \times 10^{18}$ to $1 \times 10^{20}$ cm$^{-3}$. This allows reducing the contact resistance with the source electrode 107 and the drain electrode 108.

Further, the thickness of the second etch stop layer 414 may be preferably within a range of from 0.5 to 5 nm. A differential in the conduction band edge energy $E_c$ (band offset: $\Delta E_c$) is present in the interface of the second and the third electron-supplying layers 406 and 415 composed of AlGaN with the second etch stop layer 414 contacting thereto. Since a potential barrier with higher energy is created in the second etch stop layer 414, which may be a factor for increasing an access resistance between the two-dimensional electron gas and the source and the drain electrodes 107 and 108. Nevertheless, such increased access resistance can be eliminated by controlling the thickness of the second etch stop layer 414 to equal to or lower than 5 nm to sufficiently enhance the tunneling current passing beyond a potential barrier. On the other hand, it is preferable to have the thickness of the second etch stop layer 414 to be 0.5 nm or larger, in order to exhibiting the stopping function for the etching process for forming the second recess 416, as will be discussed later in detail. The second etch stop layer 414 may be preferably doped with an n-type impurity at a concentration within a range of from $5 \times 10^{18}$ to $1 \times 10^{20}$ cm$^{-3}$. The second etch stop layer 414 is doped with n-type impurity so that the access resistance between the two-dimensional electron gas and the source and the drain electrodes 107 and 108 is reduced.

The shape and the structure of the first recess 411 are similar to that of the first recess in each of the above-described respective embodiments, and the first recess 411 is formed by partially etching sections of the second electron-supplying layer 406 and the first etch stop layer 405 in the region between the source electrode 107 and the drain electrode 108 to expose the first electron-supplying layer 404. The first recess 411 extends through the second electron-supplying layer 406 and the first etch stop layer 405, and has side surfaces composed of the second electron-supplying layer 406 and the first etch stop layer 405, and also has the bottom surface composed of the first electron-supplying layer 404. In the cross section along direction for depositing each layer, the width of such first recess 411 is substantially uniform and constant from the side of the bottom to the side of the top.

The second recess 416 is formed to extend through the third electron-supplying layer 415 and the second etch stop layer 414, and is in communication with the first recess 411. In a cross section along the direction for depositing each layer, the width of the second recess is larger than the width of the first recess 411. In the cross section along direction for depositing each layer, the width of the second recess 416 is also substantially uniform and constant from the side of the bottom to the side of the top. The first insulating film 410 covers over the third electron-supplying layer 415, and further, covers the source electrode 107 and the drain electrode 108. In addition, the first this insulating film 410 covers the inside of the second recess 416, and the section of the first insulating film 410 located in the second recess 416 is provided with an opening 410A that is in communication with the first recess 411. The opening 410A extends through the first insulating film 410.

The gate insulating film 412 covers the bottom surface and the side surface of the first recess 411, the entire inner surface of the opening 410A of the first insulating film 410, and further over the first insulating film 410, and is composed of Al$_2$O$_3$ having a thickness of 25 nm. Preferable thickness of the gate insulating film is similar to that of the above-described embodiments. A rectangular cross-sectional section of the gate electrode 109 is in contact with the entire bottom surface of the first recess 411, the entire side surface of the first recess 411, and the entire inner surface of the opening 410A of the first insulating film 410 via the gate insulating film 412 to fill the first recess 411 and the opening 410A of the first insulating film 410 without a clearance. Further, the gate electrode 109 is in contact with the inner surface of the second recess 416 via the first insulating film 410 and the gate insulating film 412.

Such field effect transistor of the present embodiment may be manufactured with a process similar to that in the above-described embodiment, and the process includes an operation for providing the second etch stop layer 414 composed of InAlN on the second electron-supplying layer 406, and an operation for providing the third electron-supplying layer 415 on the second etch stop layer 414. In the operation for providing the source electrode 107 and the drain electrode 108 to be disposed separately from each other, the source electrode 107 and the drain electrode 108 are disposed on the third electron-supplying layer 415. Then, a second insulating film (not shown) having an opening formed in a region between the source electrode 107 and the drain electrode 108 is formed over the third electron-supplying layer 415. A dry etching is conducted to selectively remove the third electron-supplying layer 415 that is exposed from the opening of the second insulating film as the mask, and the section of second etch stop layer 414 under the third electron-supplying layer 415 is selectively removed. This allows forming a hole having the bottom surface constituted of a section of the second etch stop layer 414. Further, a wet etching is conducted to selectively remove the section of the second etch stop layer 414 constituting the bottom surface of the above-described hole to expose the second electron-supplying layer 406, thereby forming the second recess 416.

Then, the second insulating film as the mask is stripped, and then the first insulating film 410 is formed in a process similar to that in the above-described embodiments. The opening 410A of the first this insulating film 410 is designed to be located in the inside of the second recess 416.

According to the field effect transistor of the present embodiment, the following advantageous effects can be achieved, in addition to the advantageous effects obtainable in above-described embodiments. The present embodiment involves that, when the second recess 416 is formed, the third electron-supplying layer 415 is selectively removed via a dry etching process and the second etch stop layer 414 under the third electron-supplying layer 415 is selectively removed to form a hole having the bottom surface constituted of a section of the second etch stop layer 414. In addition, the section of the second etch stop layer 414 constituting the bottom surface of the above-described hole is removed via a wet etching process to expose the second electron-supplying layer 406 to form the second recess 416. The formation of the second recess 416 by such procedure prevents unwanted creation of an irregularity in the surface of the second electron-supplying layer 406. In addition, the formation of the second recess 416 by the above-described procedure achieves a precise stop of the etching at the surface of the second electron-supplying layer 406. If the etching cannot be precisely stopped at the surface of the second electron-supplying layer 406, it is difficult to determine the thickness of the second electron-supplying layer 406, in the process for forming the first recess, causing a difficulty in determining the etching amount for the second electron-supplying layer 406. On the contrary, since the etching can be precisely stopped at the surface of the second electron-supplying layer 406 in the present embodiment, the etch amount for the second electron-supplying layer 406 can be easily determined in the process for forming the first recess 411.

Figure 5:
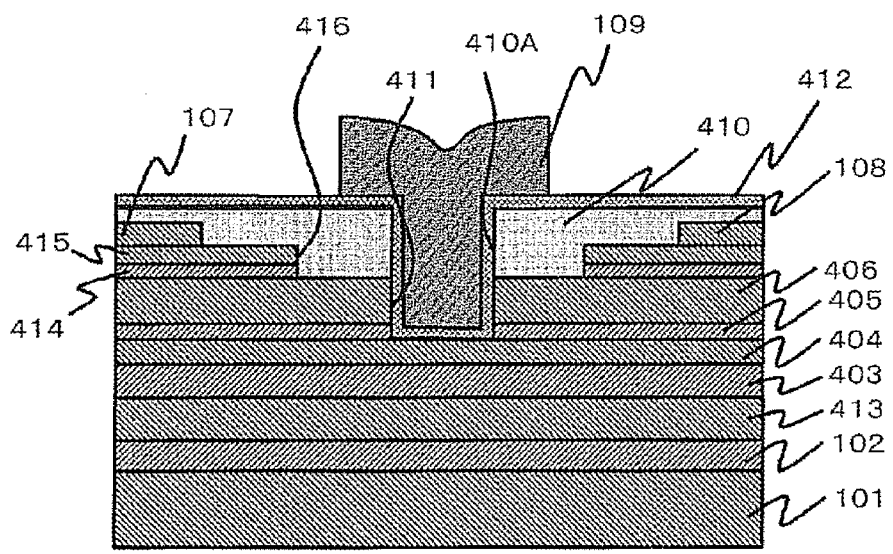
FIG. 5 is a cross-sectional view of a field effect transistor according to third embodiment of the present invention.

Since the second etch stop layer 414 and the third electron-supplying layer 415 are much more away from the T-shape gate electrode 109 than the thickness of the gate insulating film 412 in the field effect transistor according to third embodiment to shown in FIG. 5, no increase in the gate leakage current is caused even if the second etch stop layer 414 and the third electron-supplying layer 415 are doped with n-type impurities at higher concentrations. The contact resistance with the third electron-supplying layer 415 and the source and the drain electrodes 407 and 408 can reduced in the present embodiment, and 1.3 Ωmm is obtained as the ON-resistance of the field effect transistor.

The present invention is not limited to the above-mentioned embodiments, and modifications, improvements or the like for achieving the purpose of the present invention are deemed to be included in the scope of the present invention. While the above-described third embodiment employs the MIS gate structure having the gate insulating film 412 between the T-shape gate electrode 109 and the first electron-supplying layer 404, two-step recessed structures may also be similarly manufactured in the Schottky gate structure without the gate insulating film 412.

In addition, while the two-step recessed structure with the two etch stop layers composed InAlN is exemplified in the above-described third embodiment, a nitride semiconductor layer structure with three or more etch stop layers composed InAlN may be able to be adopted to achieve three- or more-step multi-layered recessed structure.

Further, while the first electron-supplying layers 104, 304 and 404, the second electron-supplying layers 106, 306 and 406, and the third electron-supplying layers 415 are composed of AlGaN layers in each of the above-described embodiments, the material thereof is not limited thereto, and these layers may alternatively be composed of InAlGaN layers. More specifically, the first electron-supplying layer may be composed of $In_xAl_yGa_{1-x-y}N$ ($0 \leq x<1$, $0<y<1$, $0<x+y<1$), the second electron-supplying layer may be composed of $In_aAl_bGa_{1-a-b}N$ ($0 \leq a<1$, $0<b<1$, $0<a+b<1$), and the third electron-supplying layer may be composed of $In_cAl_dGa_{1-c-d}N$ ($0 \leq c<1$, $0<d<1$, $0<c+d<1$). Further, InAlN of the first layer and the second layer are not limited to have the composition of the above-described embodiments, and these layers may preferably contain InAlN as a major constituent. In addition, an intermediate layer composed of GaN having a thickness within a range of from 0.5 nm to 10 nm may be formed between the first electron-supplying layer and the first etch stop layer in second embodiment and in third embodiment, similarly as in first embodiment. Further, while the first insulating film 110 is formed after the source electrode S and the drain electrode D are formed in each of the above-described embodiments, the operations are not limited thereto. For example, the first insulating film 110 may be formed before the source electrode S and the drain electrode D are formed. In such case, it is configured that the source electrode S and the drain electrode D are not covered with the first insulating film 110. Further, the source electrode S and the drain electrode D may be formed after the gate electrode G is formed. However, since this procedure may cause a heat of higher temperature released in the process for forming the source electrode S and the drain electrode D, which is adversely conducted to the gate electrode G, the drain electrode D and the source electrode S may be desirably formed prior to forming the gate electrode G.

The composition, the doping concentration and the thickness of the respective nitride semiconductors, the type and the multiple-layered structure of the metallic material of the respective electrodes and the type and the thicknesses of the respective insulating films or the like are specifically disclosed for the purpose of fully describing the field effect transistor of the above-described respective embodiments according to the present invention. It is intended that the scope of the present invention is not particularly limited to the numerical values and the types of the materials disclosed in the above-described embodiments, and materials and structures generally employed for manufacturing the field effect transistor employing nitride semiconductors may also broadly employed thereto. It is also intended that the present invention is not particularly limited to the above-mentioned embodiments, and modifications, improvements or the like for achieving the purpose of the present invention are deemed to be included in the scope of the present invention.

The present application is the National Phase of PCT/JP2008/003339, filed on Nov. 17, 2008, which claims a right of priority on the basis of Japanese Patent Application No. 2007-299383 filed Nov. 19, 2007, the whole disclosure of which is hereby incorporated by reference.

The invention claimed is:
1. A field effect transistor, comprising:
a channel layer comprising gallium nitride (GaN) or indium gallium nitride (InGaN);
a first electron-supplying layer, disposed over said channel layer and comprising $In_xAl_yGa_{1-x-y}N$ ($0 \leq x<1$, $0<y<1$, $0<x+y<1$);
a first layer, disposed over said first electron-supplying layer and comprising indium aluminum nitride (InAlN);
a second electron-supplying layer, provided over said first layer and comprising $In_aAl_bGa_{1-a-b}N$ ($0 \leq a<1$, $0<b<1$, $0<a+b<1$);
a source electrode and a drain electrode, provided over said second electron-supplying layer and disposed separately from each other; and
a gate electrode provided between said source electrode and said drain electrode,
wherein a first recess is provided in said second electron-supplying layer and said first layer, said first recess extending through thereof and comprising a bottom surface including a section of said first electron-supplying layer, wherein said gate electrode covers the bottom surface of said first recess and is buried in said first recess, wherein said second electron-supplying layer is provided so as to overlap with regions of an interface between said first electron-supplying layer and said channel layer except a region thereof under the bottom surface of said first recess covered by said gate electrode, in a plan view from a side of each of the surfaces of said layers, wherein said first electron-supplying layer and said second electron-supplying layer comprise aluminum gallium nitride (AlGaN), wherein a content ratio of aluminum (Al) in said second electron-supplying layer is equal to or higher than a content ratio of Al in said first electron-supplying layer, and wherein said first layer comprising indium aluminum nitride has a thickness of within a range of from 0.5 nm to 5 nm, wherein the first layer is in contact with the first electron-supplying layer, and wherein an Al content ratio in the first electron-supplying layer is equal to or lower than 30%, and an Al content ratio of said first layer is equal to or higher than 80%.

2. The field effect transistor as set forth in claim 1, wherein a width of said first recess in a cross section along a direction of depositing each of the layers is constant from a side of the bottom surface of said first recess to a side of an opening of the recess, and wherein said gate electrode is in direct contact with the bottom surface of said first recess and a side surface of comprising said second electron-supplying layer.

3. The field effect transistor as set forth in claim 1, wherein a width of said first recess in a cross section along a direction of depositing each of the layers is constant from a side of the bottom surface of said first recess to a side of an opening of the recess, and wherein said gate electrode is in contact with the bottom surface of said first recess and a side surface comprising said second electron-supplying layer via a gate insulating film.

4. The field effect transistor as set forth in claim 1, further comprising:

a second layer comprising indium aluminum nitride (InAlN) provided over said second electron-supplying layer; and a third electron-supplying layer comprising $In_cAl_d Ga_{1-c-d}N$ ($0 \leq c < 1$, $0 < d < 1$, $0 < c+d < 1$) is provided over said second layer, wherein said source electrode and said gate electrode are disposed over said third electron-supplying layer, wherein a second recess is formed in said third electron-supplying layer and in said second layer, said second recess extending through said third electron-supplying layer and said second layer and communicating with said first recess, and wherein said gate electrode is provided in said second recess and in said first recess, 5. The field effect transistor as set forth in claim 1, wherein a width of said second recess is larger than a width of said first recess, wherein a first insulating film is provided to partially fill said second recess and cover said third electron-supplying layer, wherein an opening communicating with said first recess is formed in a section of said first insulating film in an inside of said second recess, and wherein said gate electrode, is provided in an opening of said first insulating film in said second recess and in said first recess.

6. The field effect transistor as set forth in claim 1, wherein the Al content ratio of said first layer comprising indium aluminum nitride is equal to or higher than 81% and equal to or lower than 85%.

* * * * *